(12) United States Patent
Cheng et al.

(10) Patent No.: US 9,673,646 B1
(45) Date of Patent: Jun. 6, 2017

(54) SURFACE-TREATED ELECTROLYTIC COPPER FOIL AND METHOD FOR WIRELESS CHARGING OF FLEXIBLE PRINTED CIRCUIT BOARD

(71) Applicant: Chang Chun Petrochemical Co., Ltd., Taipei (TW)

(72) Inventors: Kuei-Sen Cheng, Taipei (TW); Yao-Sheng Lai, Taipei (TW)

(73) Assignee: Chang Chun Petrochemical Co., Ltd., Taipei (TW)

( * ) Notice: Subject to any disclaimer, the term of this patent is extended or adjusted under 35 U.S.C. 154(b) by 0 days.

(21) Appl. No.: 15/241,264

(22) Filed: Aug. 19, 2016

(51) Int. Cl.
| | | |
|---|---|---|
| *B21C 37/02* | (2006.01) |
| *H02J 7/00* | (2006.01) |
| *C23F 1/00* | (2006.01) |
| *C23F 17/00* | (2006.01) |
| *C22F 1/08* | (2006.01) |
| *B29C 65/00* | (2006.01) |
| *B29C 65/18* | (2006.01) |
| *C25D 1/04* | (2006.01) |
| *C25D 1/20* | (2006.01) |
| *C25D 3/12* | (2006.01) |
| *C25D 3/22* | (2006.01) |
| *C25D 9/04* | (2006.01) |
| *H02J 7/02* | (2016.01) |
| *H02J 50/10* | (2016.01) |
| *H05K 3/20* | (2006.01) |

(Continued)

(52) U.S. Cl.
CPC ............ *H02J 7/0042* (2013.01); *B29C 65/18* (2013.01); *B29C 66/8341* (2013.01); *C22F 1/08* (2013.01); *C23F 1/00* (2013.01); *C23F 17/00* (2013.01); *C25D 1/04* (2013.01); *C25D 1/20* (2013.01); *C25D 3/12* (2013.01); *C25D 3/22* (2013.01); *C25D 9/04* (2013.01); *H02J 7/025* (2013.01); *H02J 50/10* (2016.02); *H05K 3/20* (2013.01); *B29K 2079/085* (2013.01); *B29L 2009/00* (2013.01); *B29L 2031/3425* (2013.01)

(58) Field of Classification Search
None
See application file for complete search history.

(56) References Cited

U.S. PATENT DOCUMENTS 5,215,646 A * 6/1993 Wolski ............... C25D 1/04 204/208
6,372,113 B2 * 4/2002 Yates ............... C25D 1/04 205/111

(Continued)

FOREIGN PATENT DOCUMENTS

| CN | 204526301 U | 8/2015 |
| JP | 2011219790 A | 11/2011 |

(Continued)

*Primary Examiner* — Humera Sheikh
*Assistant Examiner* — Seth Dumbris
(74) *Attorney, Agent, or Firm* — Polsinelli PC

(57) ABSTRACT

Disclosed are novel copper foils used as components of wireless charging systems. The copper foils can be laminated to produce flexible copper clad laminates, which can then be etched to form printed circuits (coils). The coils can be used as either, or both, of a receiver wireless charging circuit and/or a transmitter wireless charging circuit. Regulation of the chemical and physical properties of the copper foil produces higher efficiencies in the wireless charging system components.

21 Claims, 11 Drawing Sheets

(51) Int. Cl.
 *B29K 79/00* (2006.01)
 *B29L 9/00* (2006.01)
 *B29L 31/34* (2006.01)

(56) References Cited

U.S. PATENT DOCUMENTS

| | | | | |
|---|---|---|---|---|
| 8,470,450 | B2 * | 6/2013 | Hanafusa | H05K 3/38 |
| | | | | 204/192.14 |
| 2011/0311834 | A1 * | 12/2011 | Hanafusa | C25D 3/38 |
| | | | | 428/553 |
| 2013/0302635 | A1 * | 11/2013 | Obata | C23C 2/02 |
| | | | | 428/612 |
| 2015/0267313 | A1 | 9/2015 | Chou et al. | |

FOREIGN PATENT DOCUMENTS

| | | |
|---|---|---|
| JP | 4833556 B2 | 12/2011 |
| JP | 4833692 B2 | 12/2011 |
| KR | 10-1449342 B1 | 10/2014 |

\* cited by examiner

SURFACE-TREATED ELECTROLYTIC COPPER FOIL AND METHOD FOR WIRELESS CHARGING OF FLEXIBLE PRINTED CIRCUIT BOARD

BACKGROUND OF THE INVENTION

1. Field of the Invention

A surface treated, electrolytic copper foil, method for making the foil, and method for wireless charging of Flexible Printed Circuit Board (hereinafter "FPCB") are disclosed. Numerous types of devices are disclosed where such FPCB can be incorporated and wirelessly charged.

2. Description of Related Art

Many electrical devices currently contain printed circuit boards, being operated by a battery source of electrical power, including secondary batteries as the source of such electrical power. In order to recharge the secondary batteries, the device incorporating the secondary batteries includes a mechanical connector, e.g., a plug or a charging port whereby a source of charging current is connected to the plug or port. The connection heretofore was a wire, with a compatible plug, or alternatively, a docking device into which the charging port is mated.

On the other hand, recent developments have made it desirable to wirelessly charge a secondary battery(s) by transmitting an electrical current from a power source to a receiving device without the use of a physical connection. The electrical current is then used to charge, or re-charge, the battery(s) of the receiving device. In this circumstance, the receiving device can be anything from a smartphone or a wearable to a large industrial forklift.

The concept of wireless charging can be understood as power can be transferred safely over an air gap and also through any non-metal object which might exist between the coil of the transmitter circuit and the coil of a receiver circuit. Examples of such non-metal objects can be wood, plastic, granite, ceramic, glass, etc. The mains voltage is converted into high frequency alternating current (AC) in the transmitting device and is send to a transmitter coil by the transmitter circuit. Alternating current flowing within the transmitter coil creates a magnetic field which extends to a receiver coil in the receiving device (when such transmitter coil and receiver coil are within a specified distance). The magnetic field generates current within the receiver coil of the receiving device, and such current flowing within the receiver coil is converted into direct current (DC) by the receiver circuit, thus charging the battery(s) of the receiving device.

Wireless charging is based on the principle of magnetic resonance or inductive power transfer (hereinafter "IPT")—a process whereby electricity is transferred between two objects through coils.

In inductive charging, the receiving device is placed directly onto a charging surface and requires precise overlap of the transmitting and receiver coils as illustrated in FIG. 1A. This means that the receiver and transmitter must be closely aligned and the distance between the receiver and transmitter coils is limited to a few millimeters. The advantage of these tightly coupled systems is a higher efficiency compared to magnetic resonant charging.

In magnetic resonance charging (illustrated in FIG. 1B), multiple devices can be charged simultaneously and the magnetic field can be picked up from different areas by the receiving coils of multiple receiving devices. The obvious benefits of magnetic resonance charging are a larger charging area and ability to simultaneously charge multiple devices. The challenges of a magnetic resonant charging solution are the increased EMI (Electro-Magnetic Interference) and a lower efficiency compared to inductive charging.

The benefits of wireless chargers are numerous:
1. Greater convenience and ubiquity for charging of everyday devices;
2. Reduce costs associated with maintain mechanical connectors;
3. Safe powering or charging devices that need to remain sterile or hermetically sealed (waterproof);
4. Prevention of corrosion due to elements such as oxygen or water on the mechanical connections and/or charging port;
5. Elimination of sparks and debris associated with wired contacts;
6. No wire;
7. No need to carry a charger or spare batteries; and
8. Wireless charging eliminates the need for cords, connectors and electrical plugs and allows any user with a compatible device to use the same wireless charging pad.

Wound copper wire coils are currently used in wireless charging pads as the transmitter coil. They offer lower internal DC resistance, higher quality, higher efficiency, but they have greater thicknesses making it difficult to incorporate in wearables or smartphones and are more costly.

On the other hand FPCB coils can be used in a cellphone as a receiving coil, but have higher internal DC resistance, lower quality, lower efficiency, but are lower thickness and lower cost than wound copper wire coils.

Attempts have been made to produce copper clad laminates employing thin and thick copper foils as found in CN 204526301 U published 5 Aug. 2015. Other attempts to treat copper foil for copper-clad laminated board to provide high peeling strength of the copper with a resin substrate are disclosed in JP 2011219790 (A) on 4 Nov. 2011. Still further, attempts have been made to produce an electrolytic copper foil to satisfy the arithmetical mean deviation from the mean line of the profile Ra in S. Korean examined patent publication 1014493420000, published 13 Oct. 2014. Other attempts at producing copper foils are disclosed in JP Patent 4833692 B2, granted 30 Sep. 2011; and JP Patent 4833556 B2, also granted 30 Sep. 2011. None of these attempts satisfy the requirements of the disclosed embodiments.

Thus, there exists a need for improved copper foils that can be employed as FPCB coils for smartphones, wearables and other articles that do not have the drawbacks of current FPCB coils.

BRIEF SUMMARY OF THE INVENTION

In one embodiment, the copper foils 31, 33 are used in a 2-layer Flexible Copper Clad Laminate (hereinafter "FCCL") 38 wherein two copper foils 31, 33 are laminated with intervening laminae of a polymeric material, such as a thermoplastic polyimide (TPI) 30, a polyimide (PI) 32 and another laminae of thermoplastic polyimide 34 having a structure as shown in FIG. 2A.

In another embodiment, the FCCL can take the form of a 3-layer FCCL 39 of the structure illustrated in FIG. 2B in which two copper foils 31, 33 are separated by laminae of a polyimide 32 on either side of which are epoxy layers 35, 36 as adhesive.

Generally, the 2-layer FCCL 38 is more reliable than the 3-layer FCCL 39 because the adhesive layers have poor heat resistance, but the cost is higher. A FPCB coil for wireless charging can be made by the 2-layer FCCL (80%) or 3-layer FCCL (20%).

A circuit (coil) is made by etching the copper foil which is partially protected by a resist layer to form the coil. The unprotected copper foil etches downwardly, but some remarkable observations have been made.

Surprisingly, it has been found that various planar configurations (a (111) plane) etches more slowly than another planes (e.g., a (200), (220) or (311) planes); such that a thick copper foil will have lateral etching (greatest beneath the resist) as the thickness of the foil increases.

BRIEF DESCRIPTION OF THE DRAWINGS

Implementations of the present technology will now be described, by way of example only, with reference to the attached figures, wherein.

DETAILED DESCRIPTION OF THE INVENTION

The general concept of wireless charging is easy to grasp. However, merely because wireless charging is known, per se, does not mean that higher efficiencies can readily be obtained, while simultaneously lowering the cost of raw materials, reducing the costs of manufacturing the receiving coil to produce thinner articles thereby reducing the overall size and weight of the device, such as a smartphone or wearable.

Figure 1A:
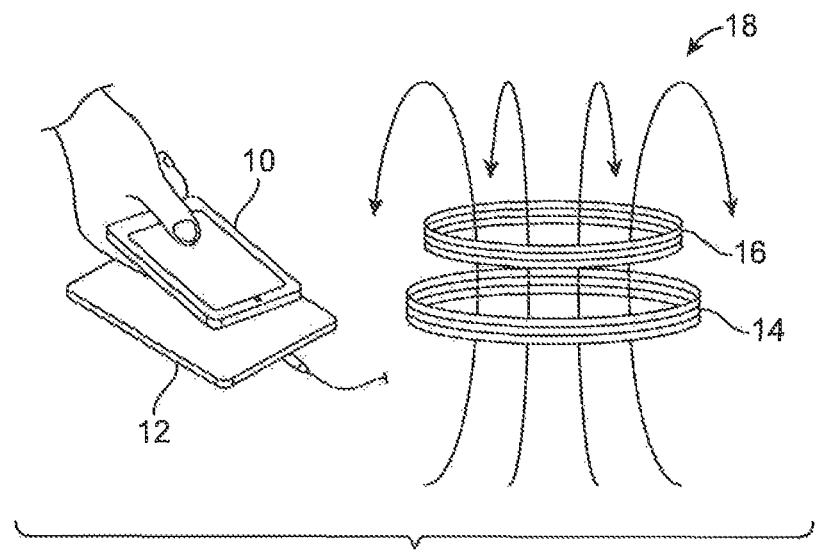
FIG. 1A is a schematic representation of inductive charging.

In inductive charging, as shown in FIG. 1A, a device 10 to be charged is placed directly on wireless charger 12 such that precise overlap of the charging coil 14 of charger 12 and the device coil 16 of device 10 allows the magnetic field 18 to induce a voltage in device coil 16.

Figure 1B:
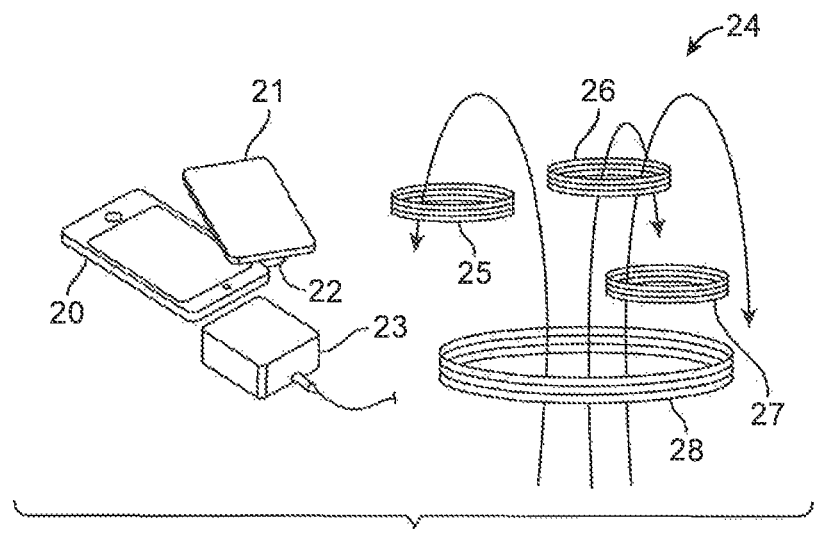
FIG. 1B is a schematic illustration of magnetic resonance charging.

In FIG. 1B is illustrated magnetic resonance charging where a number of devices 20, 21, 22 can be simultaneously charged by charger 23. The magnetic field 24 generated by a single charging coil 28 can be picked up by receiving coils 25, 26, 27 of devices 20, 21, 22, respectively.

Figure 2A:
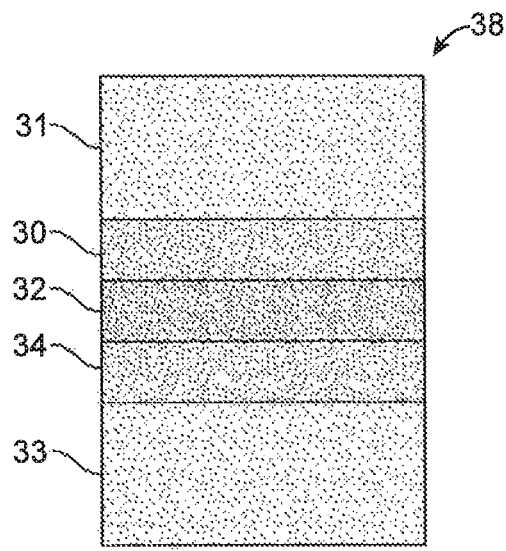
FIG. 2A is a schematic illustration of the structure of a 2-layer FCCL.
Figure 2B:
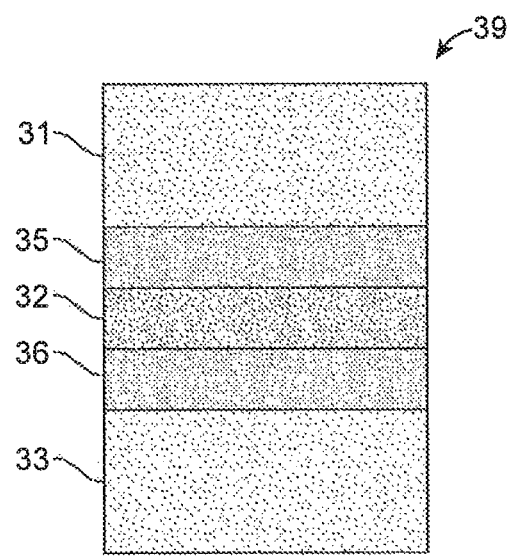
FIG. 2B is a schematic illustration of the structure of a 3-layer FCCL.
Figure 3A:
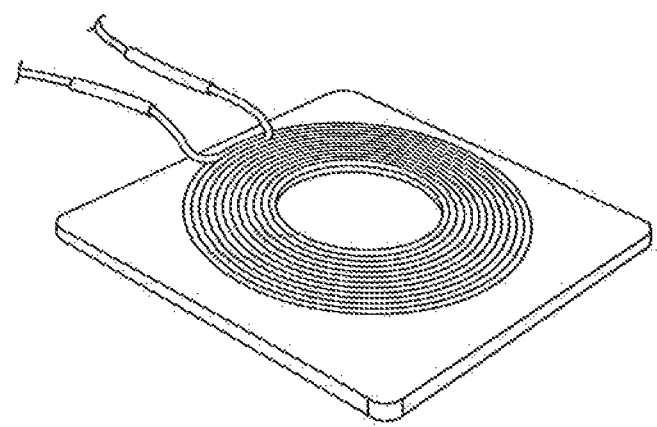
FIG. 3A is a schematic illustration of wound copper wire coil such as used in a charging pad.
Figure 3B:
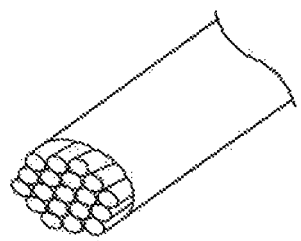
FIG. 3B is an enlarged view of the copper wire utilized in FIG. 3A.
Figure 4:
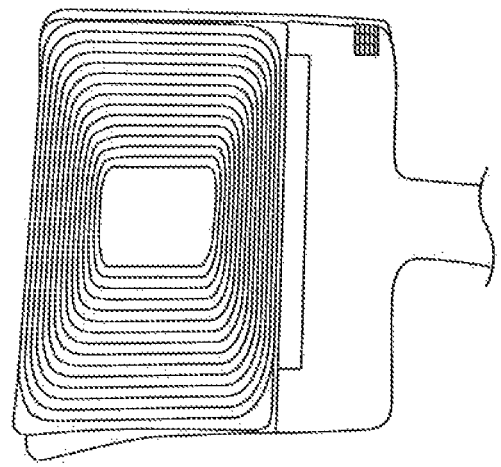
FIG. 4 is an FPCB coil as used in a cellphone as a receiving coil.

By utilizing the herein disclosed techniques, the copper content of the copper foil used to form the receiving coil can be increased for the same unit dimensions of coil. At the same time the thickness of the copper foil 31, 33 is not decreased so as to not affect the conductivity of the coil but the overall thickness of the receiving coil is reduced by reducing the thickness of the TPI (thermoplastic polyimide) layers 30, 34 and the PI (polyimide) film layer 32 in a 2-layer FCCL as shown in FIG. 2A.

This is achieved beginning with the creation of the copper foil 31 which is to be subsequently laminated with the PI film.

$$\text{Copper content (\%)}=[\text{area weight }(g/m^2)/(\text{thickness }(\mu m)\times 8.96\ (g/cm^3)^1)]\times 100 > 90(\%)$$

[1]*theoretical copper density=8.96 g/cm$^3$

Figure 6A:
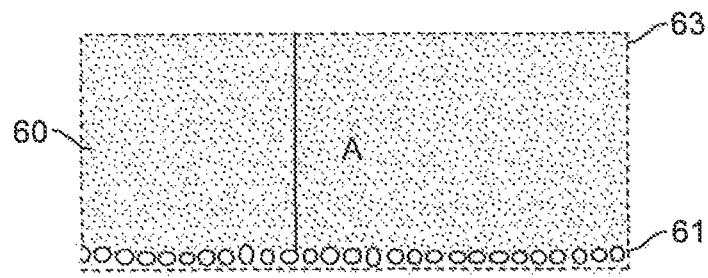
FIG. 6A illustrates a copper foil has higher copper content (%) and a nodular layer on a laminate side.
Figure 6B:
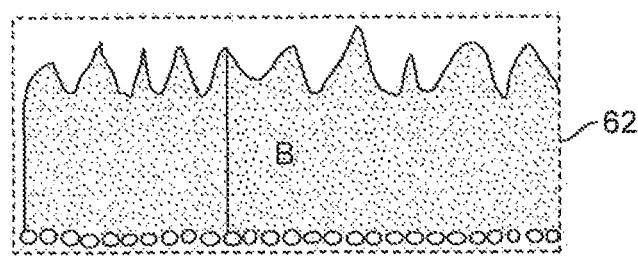
FIG. 6B illustrates a copper foil has lower copper content (%) because of having high profile on the resist side.

Thickness is measured by a micrometer. Thus, comparing the copper content (%) of the copper foil 60 of FIG. 6A with another form of copper foil 62 illustrated in FIG. 6B, where the copper content (%) of B<A will result in a coil (after etching of the copper foil) where the copper foil of higher copper content (%) shown in FIG. 6A will withstand a higher current and possess a lower internal DC resistance.

Figure 6C:
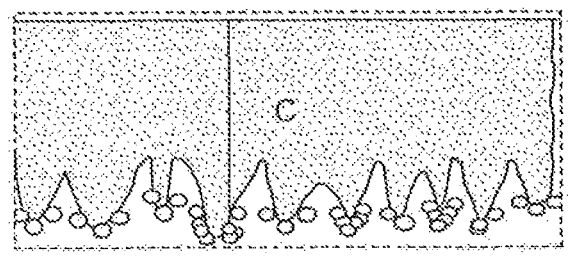
FIG. 6 C illustrates a copper foil has lower copper content (%) because of having high profile on the laminate side.
Figure 7:
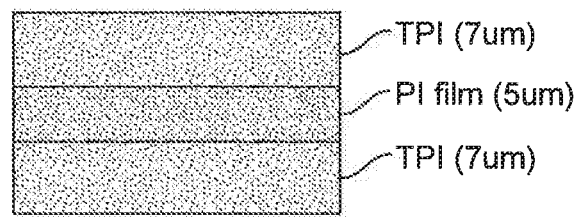
FIG. 7 is a embodiment of a TPI/PI/TPI composite film.

This higher copper content foil can be achieved as follows. The surface roughness (Rz) of the laminate side 61 of the copper foil must be in the range of 0.7 to 3.0 μm. Because the TPI layer is made very thin, if the surface roughness (Rz) of the nodule treated side (laminate side) of the copper foil is larger than 3.0 μm, the TPI cannot completely fill and voids will exist between the TPI and the nodule treated side of the copper foil. After a soldering process, the TPI and copper foil will easily delaminate. On the other hand, if the surface roughness (Rz) is lower than 0.7 μm, the peel strength will not be sufficient. The copper foil of each of FIGS. 6A-6C also has a resist side 63 opposite the nodule or laminate side 61. One embodiment of the TPI/PI/TPI composite film is shown in FIG. 7. There are various manners and protocols in which to measure surface roughness. $R_{max}$ (Max. Height Roughness) is obtained from the distance in micron meter between the highest peak and the lowest valley in the range of sampled reference length to the direction of mean line of the roughness curve. Rz (Ten points Mean Roughness) is obtained from the total in micron meter of the mean value of the each distance between the mean line and 5 peaks from the highest one, and the mean value of the each distance between the mean line and the 5 valleys from the lowest one, of the roughness curve in the range of sampled reference length. The above information of $R_{max}$ and Rz are based on JIS B 0601-1994.

More specially, the ratio of greatest deviation ($R_{max}$ and Rz) of copper foil of the instant disclosure must also be controlled to satisfy the following relationship: ($R_{max}$–Rz)/Rz of the laminate side (nodule treated side of copper foil) must be lower than 0.9.

Figure 8A:
FIG. 8A is a schematic representation of a copper foil having a more uniform surface roughness.
Figure 8B:
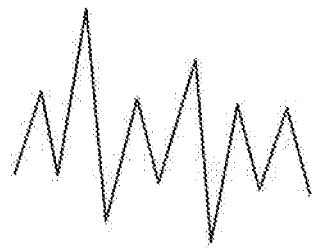
FIG. 8B is a schematic representation of a copper foil having a surface roughness greater or uneven than the surface roughness shown in FIG. 8A.

As shown in FIGS. 8A and 8B, the relationship ($R_{max}$–Rz)/Rz of FIG. 8A is lower than that relationship in FIG. 8B. This means that FIG. 8A has a more uniform surface roughness than that of FIG. 8B. The lower the relationship ($R_{max}$–Rz)/Rz, the better it is.

Figure 9:
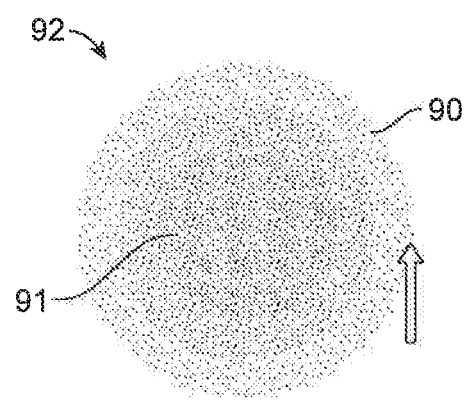
FIG. 9 is a schematic representation of the transmission of electricity by a wire according to the phenomena known as skin effect where more current travels on the outside surface of the wire than through the core of the wire.

Current likes to travel on the outside surface 90 of a conductor, such as the wire 92 illustrated in FIG. 9, while the core 91 of the wire 92 carries little current.

Figure 10:
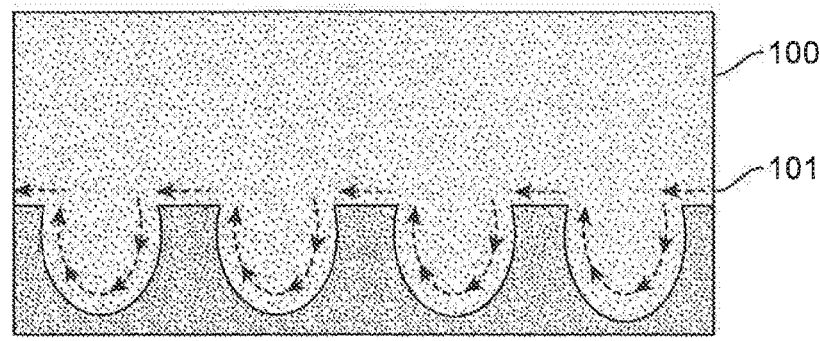
FIG. 10 is a schematic representation of the transmission of electricity along a copper foil having nodules thereon.

If the laminate side of the copper foil has a high irregular protrusion (such as in FIG. 8B), it will affect the flow of the current (the resistance will be higher) and consume the current (become heat). Thus, a wireless charging efficiency will be lower. Flow of current 101 along the surface of a copper foil 100 satisfying the relationship ($R_{max}$–Rz)./Rz lower than 0.9 is shown in FIG. 10. Thus, it is not only a requirement that the surface roughness (Rz) be within limits, but that a uniform profile is also required to produce acceptable results.

Tensile strength is also a critical factor in producing an acceptable copper foil to be used as a component of FCCL and subsequently formed receiving coils.

The tensile strength reduction rate of an electrolytic copper foil should be lower than 15% after annealing the copper foil at 200° C. for 1 hour. The tensile strength reduction rate is defined as follows:

Tensile strength reduction rate (%)=((tensile strength as received–tensile strength after 200° C.×1 hour annealing)/tensile strength as received)×100

Figure 5:
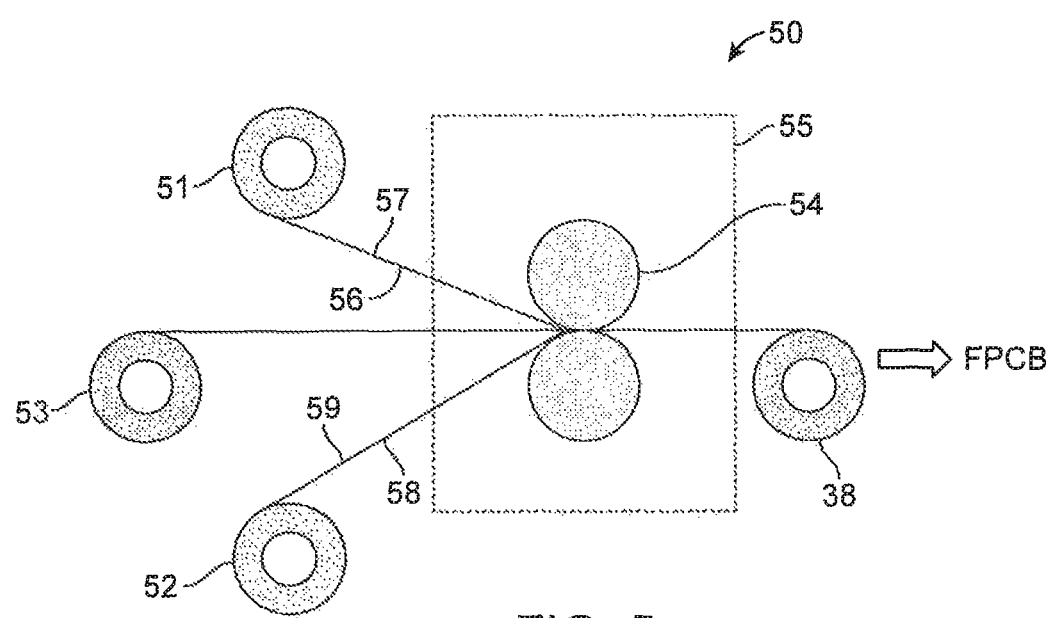
FIG. 5 is a schematic illustration of a method of forming a 2-layer FCCL by a lamination process.

The copper foil 51, 52, having respective resist sides 57, 58 and laminate sides 56, 59 will laminate with a TPI/PI/TPI composite film 53 by using 300~400° C. hot pressing roller in a 300~400° C. oven 55 for about two minutes and because the temperature is very high, the copper foil 51, 52 may recrystallize. A schematic representation of the lamination process 50 is illustrated in FIG. 5. If copper foil 51, 52 recrystallizes, the tensile strength will decrease, because the grain size becomes larger.

Figure 20:
FIG. 20 is a schematic illustration of a copper foil laminate exhibiting the undesirable trait of becoming wavy (bending) after hot pressing; and, It should be understood that the various aspects are not limited to the arrangements and instrumentality shown in the drawings.

If the tensile strength reduction rate is higher than 15%, it means that the copper foil is easy to recrystallize, the dimensions of the copper foil will change to become larger, and the copper foil will become thermally unstable. After a hot-pressing process, a 2-layer FCCL will easily become wave type (bending), as shown in FIG. 20.

Copper foils of the instant disclosure typically have tensile strength in the range of 29 to 39 kg/mm² at room temperature (no annealing treatment). If the tensile strength of copper foil is lower than 29 kg/mm², the strength will not be enough. In laminates of copper foil having low/reduced tensile strength with laminates of TPI/PI/TPI composite film, it is easy to cause wrinkles. If tensile strength is higher than 39 kg/mm², the copper foil has a higher internal stress, and, after laminating, it is also easy to become of the wave type depicted in FIG. 20.

Figure 11:
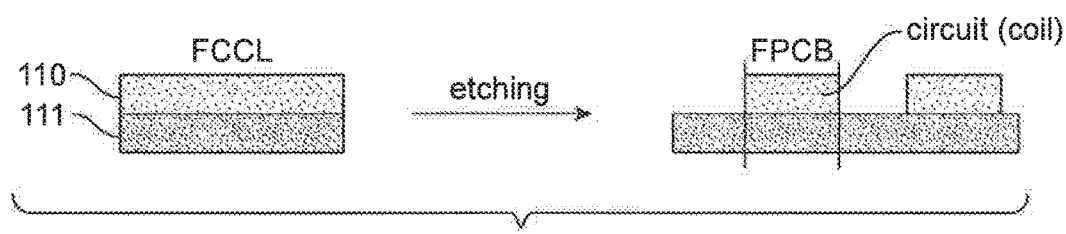
FIG. 11 is a schematic representation of the etching of an FCCL formed from a thin copper film to form a circuit (coil) illustrating good etching.
Figure 12:
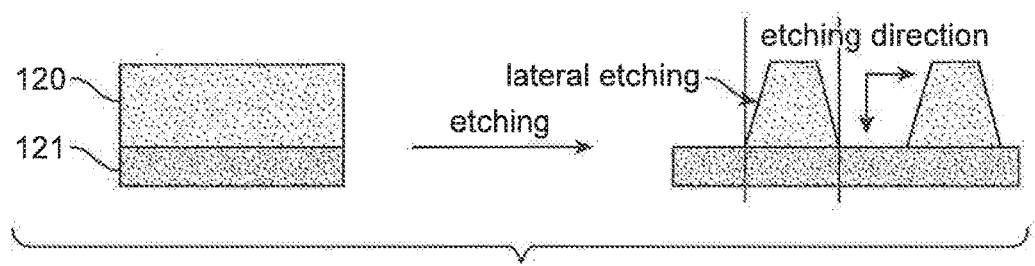
FIG. 12 is a schematic representation of the etching of an FCCL formed from a thick copper film to form a circuit (coil) illustrating lateral etching.

Unlike etching thin copper foil 110, PI film 111 laminates as in FIG. 11, it has been further been observed that thicker copper foils 120, laminated to a PI film 121, when subject to etching as in FIG. 12, produce a pronounced lateral etching (greatest beneath the resist) as the etching proceeds through the thickness of the copper foil. Such lateral etching is undesirable as it removes copper from the coil, thereby decreasing the coil's current carrying capability. In order to conduct higher current, thick copper foils on the order of 35 μm, 42 μm, 56 μm, 60 μm, 62 μm, 70 μm and larger were used to wireless charge FPCBs. The thickness of the copper foil may be from about 35 μm, 40 μm, 45 μm, 50 μm, 55 μm, 60 μm, 65 μm, 70 μm, 80 μm, 90 μm, 100 μM to about 110 μm, 130 μm, 150 μm, 170 μm, 190 μm or 210 μm. Likewise, the copper foil may be about 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, or 70 μm thick.

Figure 14:
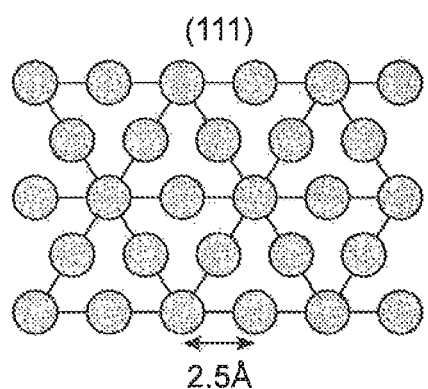
FIG. 14 is a schematic illustration of the arrangement of copper atoms in a (111) plane.
Figure 15:
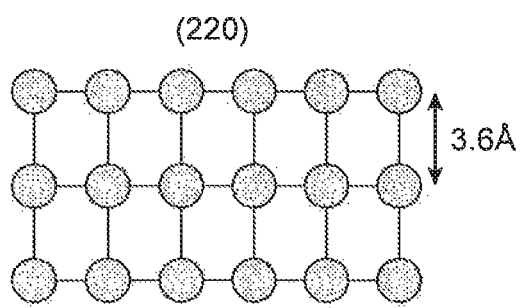
FIG. 15 is a schematic illustration of the arrangement of copper atoms in a (220) plane.

However, when the copper foils are of these thicknesses, it takes more time for the etching to create the circuit (coil). If copper foil has higher TC (Texture Coefficient) ratio of (111) plane, it means that the etching speed in the thickness direction is lower and the etching speed in the perpendicular to the thickness direction will be higher, because the (111) plane has higher atom density. Therefore, it is easy to cause lateral etching. In other words, because the atom density of (200) plane and (220) plane (shown in FIG. 15) is lower than the density in the (111) plane (shown in FIG. 14), a copper foil having a higher TC ratio of (200) plane and (220) plane, it is easier to etch the circuit (coil).

Surface treatment, such as nickel plating, also affect the etch factor. Nickel content and surface roughness (Rz) of the nodule treated side (laminate side) of the copper foil affect the etch factor. The higher the nickel content, the lower the etch factor. The higher the surface roughness (Rz) of the laminate side of the copper foil, the lower the etch factor.

Figure 16:
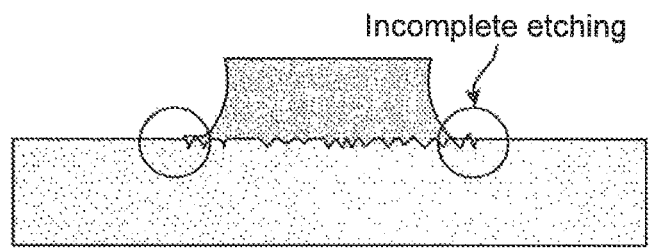
FIG. 16 is a schematic illustration of the effect of the nickel content in a nickel plating on a copper foil after etching.

Generally, nickel content of the laminate side of the copper foil should be lower than 500 μg/dm². Nickel platings on the laminate side of the copper foil can increase the adhesion between PI film and the copper foil, but if the nickel content is higher than 500 μg/dm², there will be residual copper after etching as illustrated in FIG. 16.

EXAMPLES

Example 1

Manufacture of Electrolytic Copper Foil

Copper wires were dissolved in a 50 wt % sulfuric acid aqueous solution to prepare a copper sulfate electrolyte containing 320 g/l of copper sulfate ($CuSO_4.5H_2O$) and 100 g/l of sulfuric acid ($H_2SO_4$). To per liter of the copper sulfate electrolyte, 7.97 mg of gelatin (2CP:25 Koei Chemical Co., Ltd.), 4.33 mg of sodium 3-mercapto-1-propanesulfonate (MPS:HOPAX Company), 0.2 mg of Diazine Black (SIGMA-ALDRICH) and 35 mg chloride ion were added. Subsequently, an electrolytic copper foil with thickness of 60 μm was prepared at the liquid temperature of 50° C. and a current density of 34 A/dm².

Figure 17:
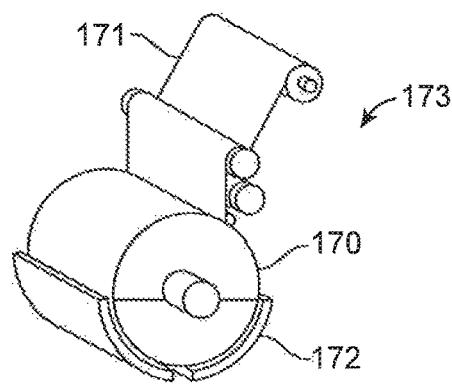
FIG. 17 is a schematic illustration of the process for forming electrolytic copper foil.

A typical apparatus for manufacturing an electrolytic copper foil 171 comprises a metal cathode drum 170 and an insoluble metal anode 172, the metal cathode drum being rotatable and having a mirror polished surface. The insoluble metal anode is arranged at approximately the lower half of the metal cathode drum and surrounds the metal cathode drum. Such an apparatus 173 is illustrated in FIG. 17. A copper foil is continuously manufactured with the apparatus by flowing a copper electrolytic solution between the cathode drum and the anode, applying an electric current between these to allow copper to be electrodeposited on the cathode drum, and detaching an electrodeposited copper foil from the cathode drum when a predetermined thickness is obtained.

The copper foil so produced has a shiny side (the surface of the copper foil formed on the cathode drum) and a matte side (the surface of the copper foil in contact with the copper sulfate electrolyte solution) which is on the surface of the copper foil opposite the shiny side.

Figure 18:
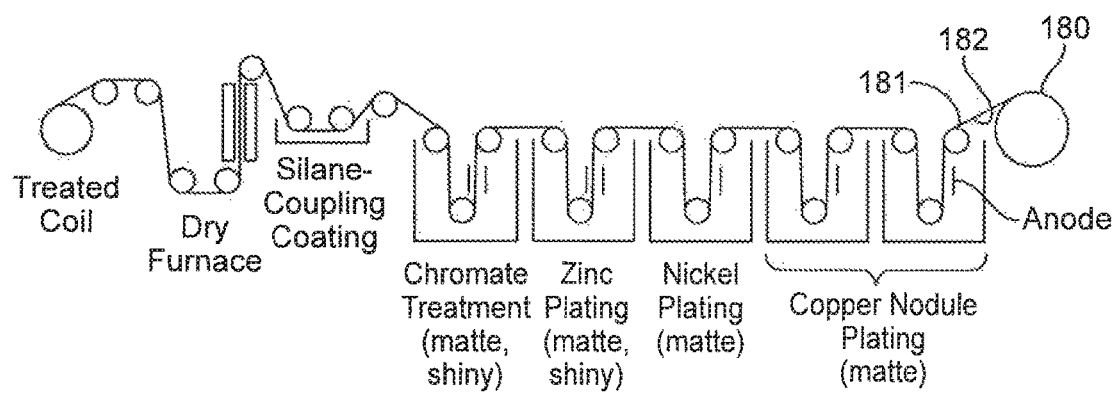
FIG. 18 is a schematic illustration of a post-treatment (surface treatment) of an electrolytic copper foil.
Figure 19:
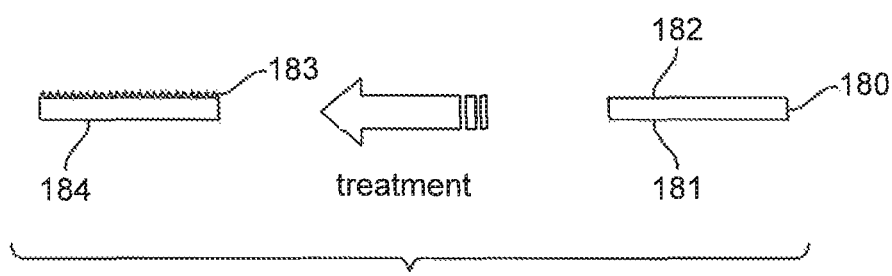
FIG. 19 is a schematic illustration of the process steps of forming copper nodules on a raw copper foil.

After 60 μm raw copper foil was produced, a surface 181, 182 of the raw copper foil 180 was treated with copper nodule plating, Ni, Co, Zn plating (alloy treatment), chromate/Zn treatment (anti-tarnish treatment) as shown schematically in FIG. 18. Either the shiny side 181 or matte side surface 182 of the copper foil can be treated with nodules. However, the nodule treated surface 183 will become the side which is laminated to the polymeric film (e.g., to a TPI/PI/TPI composite film). The laminate side (nodule treated side) 183 (nodule+Ni+Zn+Cr+Silane) is shown schematically in FIG. 19. The side opposite the laminate side is resist side 184.

Copper Nodule Treatment on the Surface of Electrolytic Copper Foil
Copper sulfate ($CuSO_4 \cdot 5H_2O$): 120 g/l
Sulfuric Acid ($H_2SO_4$): 100 g/l
Chloride ion: 3.5 ppm
Temperature: 25° C.
Current Density: 40 A/dm²
Time: 3.5 Sec
Nickel Plating Over the Copper Nodules
Nickel sulfate ($NiSO_4 \cdot 7H_2O$): 180 g/l
Boric Acid ($H_3BO_3$): 30 g/l
Sodium hypophosphite ($NaH_2PO_2$): 3.6 g/l
Temperature: 20° C.
Current Density: 0.2 A/dm²
Time: 3 Sec
pH: 3.5
Zinc Plating
Zinc sulfate ($ZnSO_4 \cdot 7H_2O$): 9 g/l
NaOH: 40 g/l
Temperature: 20° C.
Current Density: 0.2 A/dm²
Time: 5 Sec
Cr Plating
$CrO_3$; 5 g/l
Temperature: 30° C.
Current Density: 5 A/dm²
Time: 5 Sec
Silane Treatment
KBM-403: 0.25%
Time: 5 Sec The following examples are illustrative of the various aspects of the invention.

TABLE 1

| Conditions | | Example | | | | | | | Comparative Example | | | | | | |
|---|---|---|---|---|---|---|---|---|---|---|---|---|---|---|---|
| | | 1 | 2 | 3 | 4 | 5 | 6 | 7 | 1 | 2 | 3 | 4 | 5 | 6 | 7 |
| Electrolytic copper foil (Raw copper foil) | copper sulfate ($CuSO_4 \cdot 5H_2O$) (g/l) | 320 | 320 | 320 | 320 | 320 | 320 | 320 | 320 | 320 | 320 | 320 | 320 | 320 | 320 |
| | sulfuric acid ($H_2SO_4$) (g/l) | 100 | 100 | 100 | 100 | 100 | 100 | 100 | 100 | 100 | 100 | 100 | 100 | 100 | 100 |
| | chloride ion (mg/l) | 35 | 35 | 20 | 35 | 20 | 35 | 35 | 25 | 25 | 35 | 35 | 1.1 | 35 | 2.5 |
| | temperature (° C.) | 50 | 50 | 45 | 50 | 45 | 50 | 50 | 54 | 54 | 45 | 50 | 40 | 50 | 50 |
| | current density (A/dm²) | 34 | 34 | 50 | 34 | 50 | 34 | 34 | 70 | 70 | 34 | 34 | 50 | 34 | 50 |
| | gelatin (2CP) concnentration (mg/l) | 7.97 | 5.6 | 7.2 | 7.2 | 5.58 | 7.17 | 7.97 | 0.25 | 0.4 | 9.56 | 7.2 | 0 | 7.2 | 0.2 |
| | sodium 3-mercapto-1-propanesulfonate concnentration (MPS) (mg/l) | 4.33 | 3 | 3.7 | 3.7 | 3.03 | 3.72 | 4.33 | 0 | 0 | 6.06 | 3.7 | 0 | 3.7 | 0 |
| | Diazine Black (DB) concentration (mg/l) | 0.2 | 0.1 | 0.3 | 0.2 | 0.3 | 0.2 | 0.2 | 0 | 0 | 0.2 | 0.1 | 0 | 0.2 | 0 |
| Copper nodule treatment | Copper sulfate ($CuSO_4 \cdot 5H_2O$) (g/l) | 120 | 120 | 120 | 120 | 120 | 120 | 120 | 120 | 120 | 120 | 120 | 120 | 120 | 120 |
| | Sulfuric Acid ($H_2SO_4$) (g/l) | 100 | 100 | 100 | 100 | 100 | 100 | 100 | 100 | 100 | 100 | 100 | 100 | 100 | 100 |
| | Chloride ion (ppm) | 3.5 | 3.5 | 3.5 | 3.5 | 3.5 | 3.5 | 3.5 | 3.5 | 3.5 | 3.5 | 3.5 | 3.5 | 3.5 | 3.5 |
| | Temperature (° C.) | 25 | 25 | 25 | 25 | 25 | 25 | 25 | 25 | 25 | 25 | 25 | 25 | 25 | 25 |
| | Current Density (A/dm²) | 40 | 40 | 50 | 40 | 50 | 50 | 50 | 40 | 60 | 50 | 70 | 40 | 70 | 50 |
| | Time (Sec) | 3.5 | 5 | 4 | 5 | 4 | 4 | 3 | 1 | 6 | 0.5 | 3 | 5 | 3 | 4 |
| Nickel plating | Nickel sulfate ($NiSO_4 \cdot 7H_2O$) (g/l) | 180 | 180 | 180 | 180 | 180 | 180 | 180 | 180 | 180 | 180 | 180 | 180 | 180 | 180 |
| | Boric Acid ($H_3BO_3$) (g/l) | 30 | 30 | 30 | 30 | 30 | 30 | 30 | 30 | 30 | 30 | 30 | 30 | 30 | 30 |
| | Sodium hypophosphite ($NaH_2PO_2$) (g/l) | 3.6 | 3.6 | 3.6 | 3.6 | 3.6 | 3.6 | 3.6 | 3.6 | 3.6 | 3.6 | 3.6 | 3.6 | 3.6 | 3.6 |
| | Temperature (° C.) | 20 | 20 | 20 | 20 | 20 | 20 | 20 | 20 | 20 | 20 | 20 | 20 | 20 | 20 |
| | Current Density (A/dm²) | 0.2 | 0.2 | 0.2 | 0.1 | 0.2 | 0.2 | 0.2 | 0.2 | 0.2 | 0.2 | 0.2 | 0.2 | 0.2 | 0.2 |
| | Time (Sec) | 3 | 3 | 6 | 0.5 | 2 | 3.5 | 1 | 3 | 3 | 3 | 3 | 3 | 10 | 2.5 |
| | pH | 3.5 | 3.5 | 3.5 | 3.5 | 3.5 | 3.5 | 3.5 | 3.5 | 3.5 | 3.5 | 3.5 | 3.5 | 3.5 | 3.5 |
| Zinc plating | Zinc sulfate ($ZnSO_4 \cdot 7H_2O$) (g/l) | 9 | 9 | 9 | 9 | 9 | 9 | 9 | 9 | 9 | 9 | 9 | 9 | 9 | 9 |
| | NaOH (g/l) | 40 | 40 | 40 | 40 | 40 | 40 | 40 | 40 | 40 | 40 | 40 | 40 | 40 | 40 |
| | Temperature (° C.) | 20 | 20 | 20 | 20 | 20 | 20 | 20 | 20 | 20 | 20 | 20 | 20 | 20 | 20 |

TABLE 1-continued

|  | Conditions | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|---|---|---|---|---|
| Cr plating | Current Density (A/dm$^2$) | 0.2 | 0.2 | 0.2 | 0.2 | 0.2 | 0.2 | 0.2 | 0.2 | 0.2 | 0.2 | 0.2 | 0.2 | 0.2 | 0.2 |
|  | Time (Sec) | 5 | 5 | 5 | 5 | 5 | 5 | 5 | 5 | 5 | 5 | 5 | 5 | 5 | 5 |
|  | CrO$_3$ (g/l) | 5 | 5 | 5 | 5 | 5 | 5 | 5 | 5 | 5 | 5 | 5 | 5 | 5 | 5 |
|  | Temperature (° C.) | 30 | 30 | 30 | 30 | 30 | 30 | 30 | 30 | 30 | 30 | 30 | 30 | 30 | 30 |
|  | Current Density (A/dm$^2$) | 5 | 5 | 5 | 5 | 5 | 5 | 5 | 5 | 5 | 5 | 5 | 5 | 5 | 5 |
|  | Time (Sec) | 5 | 5 | 5 | 5 | 5 | 5 | 5 | 5 | 5 | 5 | 5 | 5 | 5 | 5 |
| Silane treatment | KBM-403 (wt %) | 0.25 | 0.3 | 0.3 | 0.3 | 0.25 | 0.25 | 0.25 | 0.25 | 0.3 | 0.25 | 0.3 | 0.3 | 0.3 | 0.3 |
|  | Time (Sec) | 5 | 5 | 5 | 5 | 5 | 5 | 5 | 5 | 5 | 5 | 5 | 5 | 5 | 5 |

TABLE 2

|  |  | Example 1 | Example 2 | Example 3 | Example 4 | Example 5 | Example 6 | Example 7 |
|---|---|---|---|---|---|---|---|---|
| Thickness of copper foil (μm) |  | 60.1 | 60.2 | 60.1 | 35.1 | 66.1 | 70.0 | 210.2 |
| Area weight of copper foil (g/m$^2$) |  | 532.3 | 486.5 | 498.1 | 295.3 | 563.8 | 594.6 | 1819 |
| Copper content of copper foil (%) |  | 98.8 | 90.2 | 92.5 | 93.9 | 95.2 | 94.8 | 96.6 |
| Tensile strength (kg/mm$^2$) |  | 29.8 | 38.5 | 33.3 | 32.9 | 36.2 | 32.3 | 31.7 |
| Tensile strength after 200° C. × 1 hr annealing (kg/mm$^2$) |  | 29.0 | 32.8 | 31.3 | 30.1 | 32.0 | 30.5 | 30.5 |
| Tensile strength reduction rate (%) |  | 2.7 | 14.8 | 6.0 | 8.5 | 11.6 | 5.6 | 3.8 |
| Resist side roughness (μm) | Rz | 1.06 | 2.16 | 1.67 | 1.41 | 1.26 | 1.22 | 1.14 |
| Laminate side roughness (μm) | Rz | 0.77 | 2.96 | 2.48 | 2.19 | 1.79 | 1.65 | 1.30 |
|  | R$_{max}$ | 1.36 | 3.80 | 3.40 | 3.24 | 2.70 | 3.12 | 1.89 |
|  | (R$_{max}$-Rz)/Rz | 0.77 | 0.28 | 0.37 | 0.48 | 0.51 | 0.89 | 0.45 |
| Texture coefficient after 200° C. × 1 hr annealing | TC(111) | 0.67 | 0.80 | 0.24 | 0.54 | 0.52 | 0.50 | 0.56 |
|  | TC(200) | 1.64 | 1.12 | 3.26 | 1.66 | 2.31 | 1.77 | 1.42 |
|  | TC(220) | 0.84 | 0.89 | 0.27 | 0.80 | 0.57 | 0.77 | 0.85 |
|  | TC(311) | 0.85 | 1.19 | 0.23 | 1.00 | 0.60 | 0.96 | 1.17 |
|  | [TC(200) + TC(220)]/[TC(111) + TC(200) + TC(220) + TC(311)] (%) | 62.0 | 50.3 | 88.3 | 61.8 | 72.0 | 63.5 | 56.8 |
| Nickel content of laminate side (μg/dm$^2$) |  | 264 | 251 | 496 | 10.2 | 158 | 304 | 86 |
| Peel strength (kg/cm) |  | 1.78 | 2.21 | 2.18 | 1.86 | 2.12 | 2.16 | 2.22 |
| Etch factor |  | 4.2 | 3.7 | 3.6 | 5.4 | 3.8 | 3.6 | 3.5 |
| residual nickel after etching |  | No | No | No | No | No | No | No |
| FCCL causes bending after laminate |  | No | No | No | No | No | No | No |
| The max current that 100 um width coil can withstand (mA) |  | 54.4 | 50.7 | 51.9 | 27.3 | 54.6 | 55.5 | 175 |

TABLE 3

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Thickness of copper foil (μm) |  | 60.1 | 60.0 | 60.1 | 60.2 | 60.1 | 60.0 | 60.0 |
| Area weight of copper foil (g/m$^2$) |  | 455.6 | 447.8 | 531.0 | 516.7 | 507.3 | 513.9 | 511.8 |
| Copper content of copper foil (%) |  | 84.6 | 83.3 | 98.6 | 95.8 | 94.2 | 95.6 | 95.2 |
| Tensile strength (kg/mm$^2$) |  | 37.1 | 37.5 | 33.2 | 33.6 | 53.2 | 32.5 | 45.6 |
| Tensile strength after 200° C. × 1 hr annealing (kg/mm$^2$) |  | 33.7 | 36.2 | 31.3 | 31.6 | 27.8 | 31.2 | 36.6 |
| Tensile strength reduction rate (%) |  | 9.2 | 3.6 | 5.6 | 6.0 | 47.7 | 4.0 | 19.8 |
| Resist side roughness (μm) | Rz | 1.86 | 9.77 | 1.16 | 1.23 | 1.47 | 1.26 | 1.22 |
| Laminate side roughness (μm) | Rz | 6.28 | 3.62 | 0.45 | 1.81 | 2.17 | 1.91 | 1.98 |
|  | R$_{max}$ | 7.84 | 5.57 | 0.82 | 4.15 | 3.00 | 3.64 | 2.95 |
|  | (R$_{max}$-Rz)/Rz | 0.25 | 0.54 | 0.82 | 1.29 | 0.38 | 0.91 | 0.49 |
| Texture coefficient after 200° C. × 1 hr annealing | TC(111) | 0.63 | 0.05 | 0.59 | 0.61 | 1.23 | 0.56 | 1.72 |
|  | TC(200) | 0.56 | 0.03 | 1.57 | 1.22 | 2.03 | 1.42 | 1.07 |
|  | TC(220) | 2.07 | 3.80 | 0.85 | 0.98 | 0.39 | 0.85 | 0.44 |
|  | TC(311) | 0.74 | 0.12 | 0.99 | 1.19 | 0.35 | 1.17 | 0.77 |
|  | [TC(220) + TC(220)]/[TC(111) + TC(200) – TC(220) + TC(311) ] (%) | 65.5 | 95.5 | 60.5 | 55.0 | 60.5 | 56.8 | 37.8 |
| Nickel content of laminate side (μg/dm$^2$) |  | 258 | 246 | 262 | 252 | 237 | 896 | 232 |
| Peel strength (kg/cm) |  | 2.67 | 2.20 | 1.34 | 2.06 | 2.15 | 2.12 | 2.10 |
| Etch factor |  | 2.8 | 3.4 | 4.5 | 5.0 | 3.9 | 2.9 | 3.0 |
| residual copper after etching |  | No | No | No | No | No | YES | No |

TABLE 3-continued

| | Comparative Example | | | | | | |
|---|---|---|---|---|---|---|---|
| | 1 | 2 | 3 | 4 | 5 | 6 | 7 |
| FCCL causes bending after laminate | No | No | No | No | YES | No | YES |
| The max current that 100 um width coil can withstand (mA) | 44.3 | 44.5 | 54.6 | 52.1 | 51.6 | 51.6 | 51.9 |

Test Methods
Copper Content

Copper content (%): [area weight (g/m$^2$)/(thickness (μm)×8.96$^2$ (g/cm$^3$))]×100

$^2$Theoretical copper density=8.96 g/cm$^3$ (1) Area Weight
 1. Cut the copper foil specimen by the size of 100 mm×100 mm.
 2. Use an electronic balance to measure the weight of the copper foil specimen. Electronic balance must be capable of weighing accuracy to ±0.1 mg.
 3. Transfer to area weight by g/m$^2$ unit.

(2) Thickness
 1. The thickness of copper foil is measured by using high accuracy micrometer (Mitutoyo 293-100 MDH-25M). Enabling 0.000005"/0.1 μm resolution measurement.

Tensile Strength

Based on the method of IPC-TM-650, the electrolytic copper foil was cut to obtain a test sample with the size of 100 mm×12.7 mm (length×width), and the test sample was measured at room temperature (about 25° C.) under the conditions of a chuck distance of 50 mm and a crosshead speed of 50 min/min by using Model AG-I testing machine of Shimadzu Corporation.

Roughness

The measurement was conducted based on the method of JIS B 0601-1994 by using a Type Surface Roughness Measuring Instrument (Kosaka Laboratory Ltd; SE 1700 series).

Ni Content

The Nickel content was determined by cutting the copper foil to a size of 150×150 mm and placing a protective coating on one side of the copper foil (the coating prevents the copper foil from dissolving). After drying, the specimen was further cut into a size of 100×100 mm (area=1 dm$^2$). The specimens were then put into a dish and dissolved with 20 ml of 18% HCl solution and 3 ml of 30% H$_2$O$_2$ solution. After the specimens were dissolved, the solution was poured into a 50 ml volumetric flask. The dish was rinsed with water to reach the final volume. The amount of Nickel was measured according to ICP-AES.

Texture Coefficient (TC)

A PW3040-type X-ray powder diffractometer manufactured by PANalytical B.V. was used for analysis, under the conditions of an external voltage of 45 kV, a current of 40 mA, a scanning resolution of 0.04°, and a scanning range (2θ) of from 40° to 95°. The texture coefficient of each of the test pieces was calculated by using the following equation (1):

$$TC(hk1) = \frac{I(hk1)/I_0(hk1)}{(1/n)\sum I(hk1)/I_0(hk1)} \quad \text{Equation (1)}$$

In equation (1), TC (hk1) represents a texture coefficient of a (hk1) crystal plane, the greater the value of TC is, the higher the level of preferred orientation of the crystal face is; I (hk1) represents the diffraction intensity of the (hk1) crystal plane of the test piece analyzed; $I_0$(hk1) represents the diffraction intensity of the (hk1) crystal plane of standard copper powder, as determined by the American Society of Testing Materials (ASTM) (PDF#040836); and n represents the number of diffraction peaks in the range of a specific diffraction angle (2θ).

Texture coefficients of the surface treated copper foil for each of a (111) plane, a (200) plane, a (220) plane and a (311) plane is obtained by calculation from measurement of X-ray diffraction intensity of the resist side after 200° C.×1 hr. Annealing.

Peel Strength

A sample was cut from the copper-clad laminates, then the surfaced-treated copper foil was peeled off from the substrate (resin board) with a measured specimen width of 10 mm according to the method prescribed in JIS C6511.

Etch Factor

Figure 13:
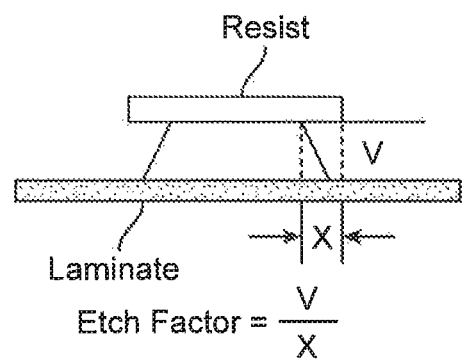
FIG. 13 is a schematic illustration of the Etch Factor=V/x.

The copper patterns were formed as line width, 100 μm and spacing, 30 μm with chemical etching process, then etch factor of a copper pattern was measured using Scanning Electron Microscope (SEM), where the etch factor is defined by a ratio of V/X as shown in FIG. 13.

Residual Copper after Etching

The copper patterns were formed as line width, 100 μm and spacing, 30 μm with chemical etching process. The line edge was observed with Scanning Electron Microscope (SEM) in order to determine whether the edge of line has residual copper or not.

Applications of Wireless Charging

Wireless Charging for Smartphones and Tablets

Examples include improved charging apparatus for wireless charging of smartphones and tablets involve the use of a charging pad which acts as the transmitter, transferring power to a miniaturized wireless receiver integrated into the smartphone or tablet. Thus, there is no need to carry multiple external power adapters.

Wireless Charging for Wearables

In order to truly deliver wireless charging for all consumer electronic devices, the technology needed to somehow enable charging of irregularly shaped objects, i.e., not thin form or flat in shape, and capable of holding and wirelessly charging multiple irregular shaped devices at one time.

Automotive Application of Wireless Charging

Multiple electronic devices can be simultaneously wirelessly charged in the passenger compartment of an automobile. Examples include improved charging apparatus for any type of electric vehicle, the lithium ion battery(s) of an electric vehicle (EV) can also be wirelessly charged through a ground transmission unit beneath the EV, rather than through the mechanical connectors now employed for charging the various models of electric vehicles. The same manner of charging used for EV can also be employed in industrial charging of equipment where wireless power systems are used in wet, dirty and moving environments, such as for charging a forklift, front end loader, hoist, tractor and other industrial equipment.

Use of Furniture for Wireless Charging of Consumer Electronics

Furniture can be the source of the wireless charging transmitter. The power supply can be integrated into desks, tables and even appliances. This would permit wireless charging stations in desks in hotels, offices, schools and homes; conference tables, restaurants and coffee shops, movie theaters, etc.

While we have disclosed the various embodiments of the manner of making, using and employing wireless charging systems and the sub-components thereof, it should be understood that such embodiments are exemplary only and do not limit this disclosure as embraced by the appended claims.

The invention claimed is:

1. A surface treated copper foil comprising:
   (a) a copper content greater than 90%;
   (b) $(R_{max}-Rz)/Rz$ of a laminate side of the copper foil is lower than 0.9;
   (c) a tensile strength reduction rate is lower than 15% after 200° C.×1 hr annealing;
   (d) based on a total sum of texture coefficients of a (111) plane, a (200) plane, a (220) plane and a (311) plane of the surface treated copper foil, a sum of the texture coefficients of the (200) plane and the (220) plane of the surface treated copper foil is greater than 50%, wherein texture coefficients of the surface treated copper foil for each of a (111) plane, a (200) plane, a (220) plane and a (311) plane is obtained by calculation from measurement of X-ray diffraction intensity on a resist side after 200° C.×1 hr. annealing; wherein the tensile strength is in the range of 29 to 39 kg/mm² at room temperature.

2. The surface treated copper foil of claim 1, wherein the surface roughness (Rz) of the laminate side is in the range of 0.7 to 3.0 μm.

3. The surface treated copper foil of claim 1, wherein a nickel content of the laminate side is lower than 500 μg/dm².

4. The surface treated copper foil of claim 1, wherein the TC (111) is lower than 1.0 after 200° C.×1 hr. annealing.

5. The surface treated copper foil of claim 1, wherein the TC (200) is larger than 1.0 after 200° C.×1 hr. annealing.

6. The surface treated copper foil of claim 1, wherein the surface roughness of resist side is lower than 2.2 μm.

7. The surface treated copper foil of claim 1, wherein the thickness of the copper foil is in the range of 35 to 210 μm.

8. The surface treated copper foil of claim 7, wherein the thickness is in the range of 35 to 70 μm.

9. The surface treated copper foil of claim 1, further comprising a layer of copper nodules.

10. The surface treated copper foil of claim 9, further comprising a silane coupling agent.

11. The surface treated copper foil of claim 9, further comprising a Zn treatment.

12. The surface treated copper foil of claim 9, further comprising a chromate treatment.

13. A flexible copper clad laminate comprising two layers of the surface treated copper foil according to claim 1 laminated to composite film.

14. The flexible copper clad laminate according to claim 13, wherein the composite film comprises a polyimide sandwiched between two layers of thermoplastic film.

15. A method of making the flexible copper clad laminate of claim 13 comprising;
   providing two spaced layers of the surface treated copper foil;
   providing the composite film between the spaced layers of copper foil;
   feeding the two layers of copper foil and the composite film through a hot press at a temperature in the range of 300°~400° C. for a time period of about 2 minutes to form a two layer flexible copper clad laminate.

16. The method of claim 15 further comprising etching the copper clad laminate to form a circuit.

17. The method according to claim 16, wherein the circuit is a coil of a wireless charging flexible printed circuit board.

18. A wireless charging receiver comprising the surface treated copper foil of claim 1.

19. The wireless charging receiver of claim 18, wherein the receiver is one selected from the group consisting of smartphones, tablets, wearables, automobiles, industrial machinery and combinations thereof.

20. A wireless charging transmitter comprising the surface treated copper foil of claim 1.

21. The wireless charging transmitter of claim 20 incorporated into at least one of a desk, a conference table, a coffee table, airport seating, theater seating, airplanes and an automobile.

* * * * *